United States Patent [19]

Shimase et al.

[11] Patent Number: 4,683,378
[45] Date of Patent: Jul. 28, 1987

[54] APPARATUS FOR ION BEAM WORK

[75] Inventors: Akira Shimase, Yokohama; Hiroshi Yamaguchi, Fujisawa; Satoshi Haraichi; Tateoki Miyauchi, both of Yokohama, all of Japan

[73] Assignee: Hitachi, Ltd., Tokyo, Japan

[21] Appl. No.: 754,930

[22] Filed: Jul. 15, 1985

[30] Foreign Application Priority Data

Jul. 13, 1984 [JP] Japan ................. 59-144478

[51] Int. Cl.⁴ .................. H01J 37/304; H01J 37/302
[52] U.S. Cl. .............................. 250/492.2; 250/491.1
[58] Field of Search ............... 250/492.2, 491.1, 310, 250/492.21

[56] References Cited

U.S. PATENT DOCUMENTS 3,648,048 3/1972 Cahan et al. ............... 250/492.2
4,447,731 5/1984 Kuni et al. .................. 250/442.1
4,503,329 3/1985 Yamaguchi et al. ............. 250/492.2

OTHER PUBLICATIONS

Okamoto et al., *IEEE 7th Int. Conf. on Pattern Recognition Proceedings*, 1984, pp. 1361-1364.

Primary Examiner—Craig E. Church
Assistant Examiner—Jack I. Berman
Attorney, Agent, or Firm—Antonelli, Terry & Wands

[57] ABSTRACT

This invention discloses an ion beam work apparatus which comprises ion mean radiation means for focusing and radiating an ion beam extracted from an ion source to a target put on a moving mechanism, and scanning two-dimensionally the radiation position; secondary particle detection means for detecting the secondary particles generated from the target upon radiation of the ion beam; and superposition-display means for superposing the secondary particle image with a different kind of image containing such information that is not contained in the secondary particle image, and displaying the resulting image; and which can accurately position the beam radiation position to lower wiring layers of the target such as a semiconductor device that can not be observed by the secondary particle image obtained by scanning the focused ion beam.

8 Claims, 15 Drawing Figures

| STEP NO. | WORKING CONTENTS | CRT 60 (IMAGE PROCESSING UNIT SIDE) | CRT 14 (CENTRAL PROCESSING UNIT SIDE) |
|---|---|---|---|
| (1) | WAFER SETTING | | |
| (2) | POSITIONING OF REFERENCE CHIP | | |
| (3) | DISPLAYING OF SIM IMAGE |  |  |
| (4) | POSITIONING OF SIDE PORTION OF REFERENCE CHIP |  |  |
| (5) | POSITION ADJUSTING OF POSITIONING PATTERN |  | |
| (6) | CONVERTING SIM IMAGE TO BINARY CODE | | |
| (7) | CALCULATING OF ANGLE VARIANCE QUANTITY OF PATTERN | |  |

| STEP NO. | WORKING CONTENTS | CRT 60 (IMAGE PROCESSING UNIT SIDE) | CRT 14 (CENTRAL PROCESSING UNIT SIDE) |
|---|---|---|---|
| (8) | WORK POSITIONING OF CHIP |  |  |
| (9) | MAGNIFICATION OF SETTING OF WORK RANGE |  | |
| (10) | SETTING OF REFERENCE POINTS FOR SUPERPOSING IMAGES | |  |
| (11) | STORING OF SIM IMAGE INFORMATION | | |

| STEP NO. | WORKING CONTENTS | CRT 60 (IMAGE PROCESSING UNIT SIDE) | CRT 14 (CENTRAL PROCESSING UNIT SIDE) |
|---|---|---|---|
| (12) | DISPLAYING OF DESIGN DATA IMAGE | |  |
| (13) | SETTING OF REFERENCE POINTS FOR SUPERPOSING IMAGES | |  |
| (14) | ROTATING AND STORING OF DESIGN DATA IMAGE | |  |
| (15) | SUPERPOSING SIM IMAGE AND DESIGN DATA IMAGE | |  |

| STEP NO. | WORKING CONTENTS | CRT 60 (IMAGE PROCESSING UNIT SIDE) | CRT 14 (CENTRAL PROCESSING UNIT SIDE) |
|---|---|---|---|
| (16) | CALCULATING OF DEVIATION QUANTITY | |  |
| (17) | SUPERPOSING IMAGES AND CORRECTING ANGLE DEVIATION | |  |
| (18) | INDICATING OF WORK AREA (RANGE) | |  |
| (19) | CALCULATING OF WORK AREA (RANGE) INFORMATION | |  |

| STEP NO. | WORKING CONTENTS | CRT 60 (IMAGE PROCESSING UNIT SIDE) | CRT 14 (CENTRAL PROCESSING UNIT SIDE) |
|---|---|---|---|
| (20) | SETTING OF RADIATION CONDITION OF BEAM | | |
| (21) | APPLING OF DEFLECTION VOLTAGE | | |
| (22) | DETECTING OF END OF BEAM RADIATION | | |
| (23) | RECOGNIZING OF WORK CONDITION |  | |
| (24) | NEXT WORK POSITIONING OF CHIP / TAKING OUT WAFER | | |

APPARATUS FOR ION BEAM WORK

BACKGROUND OF THE INVENTION

This invention relates to an apparatus for various tasks for semiconductor devices using a focused ion beam such as fabrication of the semiconductor device, exposure, analysis, film formation, and so forth. More particularly, the present invention relates to an ion beam apparatus which makes it easy to set the radiating position when an ion beam is radiated to the lower layer portion of a semiconductor device.

A conventional apparatus for working a semiconductor device using a focused ion beam is disclosed in U.S. patent application Ser. No. 427,584, now U.S. Pat. No. 4,503,329 and EPC Laid-Open No. 0075949, and has the following construction. As shown in FIG. 1 of the accompanying drawings, a beam 10 which is extracted from an ion source 1 while being controlled by an ion source controller 12 is condensed by an electrostatic lens 2 which is in turn controlled by a lens controller 13. The beam 10 is then scanned two-dimensionally on a predetermined region on a target 4 held on an XY stage 5, by a deflector which scans the beam with a scanning signal from a deflector controller 15. The secondary electrons 11 generated from the target 4 are detected by a detector 6, and a luminance modulation signal corresponding to the number of secondary electrons 11 is applied to CRT 14 to provide a scanning ion microscopic image on the basis of the same principle as a scanning electron microscope (SEM). The work position is set while observing the surface of the target 4 with the scanning ion microscopic image.

The XY stage 5 which holds the target 4 is controlled by a stage controller 16. A vacuum chamber 18 is held at a vacuum of at least $1 \times 10^{-6}$ Torr by a vacuum pump 9. A stool 7 which supports the vacuum chamber 18 as a whole is put on an air support 8 to dampen vibration of the system as a whole.

In accordance with this apparatus, a positioning accuracy of $\pm 0.2$ $\mu$m can be obtained when, for example, an ion beam of gallium (Ga) is focused in a 0.1 $\mu$m$\phi$ to cut a 1 $\mu$m wide Al wiring. The workpiece to be worked by this apparatus is a semiconductor device, an exposure mask, or the like.

The section of this semiconductor device consists, for example, of an Si substrate 19, SiO$_2$ 20, an Al wiring 21, an inter-layer insulating film 22, an Al wiring 23, an inter-layer insulating film 24, an Al wiring 25 and a passivation film 26 from the lowermost layer in order named, as shown in FIG. 2.

The flatness of the insulating film 22 on the lowermost Al wiring 21 has been so improved in the past that the information on the lowermost Al wiring 21 can not be obtained by a scanning ion microscope for observing the corrugation on the surface. The information on the second Al wiring layer 23 can be obtained because the insulating film 24 on the second Al wiring 23 has not been made flat. Therefore, positioning the work can be done for the uppermost layer 26 and the second wiring 23 with the scanning ion microscope. However, since film becomes increasingly flatter, there is a strong possibility that the observation can be made only for the uppermost Al wiring 25. This will makes it difficult to locate the work positions of the lowermost Al wirings 23 and 21.

In the semiconductor device shown in FIG. 2, it is possible to observe the layers down to the lowermost Al wiring 21 with an optical microscope because the insulating films are optically transparent. Therefore, the Al wiring 21 can also be worked if the observation is first made with an optical microscope and positioning the work is then effected by a scanning ion microscope. As disclosed, for example, in U.S. Pat. No. 4,447,731 and Japanese Utility Model Publication No. 10687/1984, a conventional combination of the optical microscope with an optical observation instrument does not use an optical microscope to position the work, but is used merely for rough setting of the observation position. The magnification of the optical microscope is low, the optical axis of the optical microscope deviates from that of the optical observation instrument by 100 $\mu$m, so that no device is adequate for setting the work position in actual practice.

SUMMARY OF THE INVENTION

The present invention is directed to eliminate the problem of the prior art described above, and to provide an ion beam work apparatus which can accurately position the beam radiation position to those lower wiring layers of a semiconductor device which conventionally could not be observed by a secondary electron image obtained by scanning a focused ion beam.

To accomplish the object described above, the present invention is characterized in that an object workpiece such as a wafer, to which an ion beam is to be radiated, is placed on a stage which is arranged in advance so that it may be positioned very accurately, and an image constituted by the information obtained from the design data of a device or from an optical microscope is superposed with an image constituted from a secondary electron image [Scanning Ion Microscope image; hereinafter called an "SIM image"]obtained by scanning a focused ion beam on a target in order to make it possible to determine the beam radiation position to the lower wiring layers, and the like.

DESCRIPTION OF THE PREFERRED EMBODIMENTS

Hereinafter, some preferred embodiments of the present invention will be described with reference to the accompanying drawings. [Embodiment 1]

Figure 1:
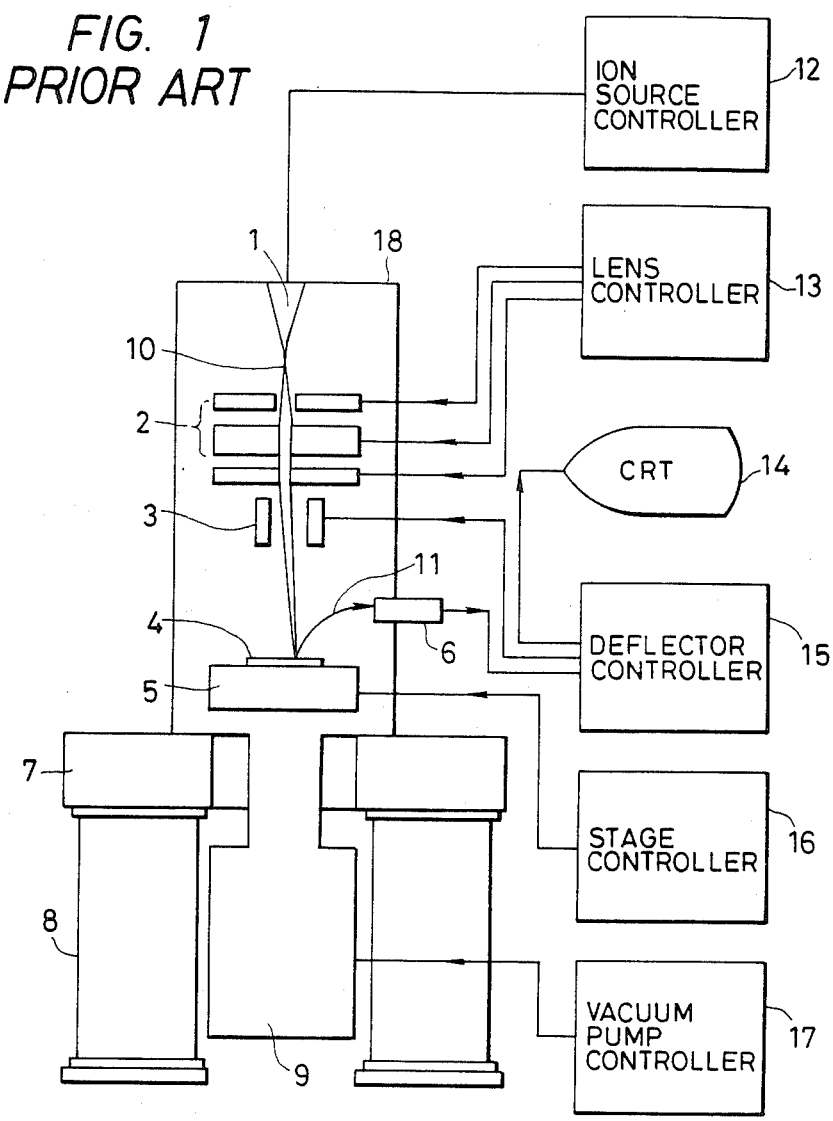
FIG. 1 is a block diagram showing the construction of a conventional focused ion beam work apparatus.

The first embodiment of the invention relates to an apparatus for setting the beam radiation position to the lowermost wiring of a semiconductor device by superposing an SIM image with the design data of the device stored in an external memory device such as a magnetic tape without using an optical microscope. Like reference numerals are used to identify like constitutents as in FIG. 1. In the drawing, the apparatus is equipped with an SIM image memory 27 for temporarily storing a secondary electron signal and a buffer memory 31 interposed between an outer memory unit 30 and a controller 29 such as a central processing unit.

The XY stage 5 sends position information to the controller 29 from a laser gauge 28 through its controller 32, and effects position control with an accuracy of $\pm 1$ $\mu$m by a stage controller 16.

Figure 4:
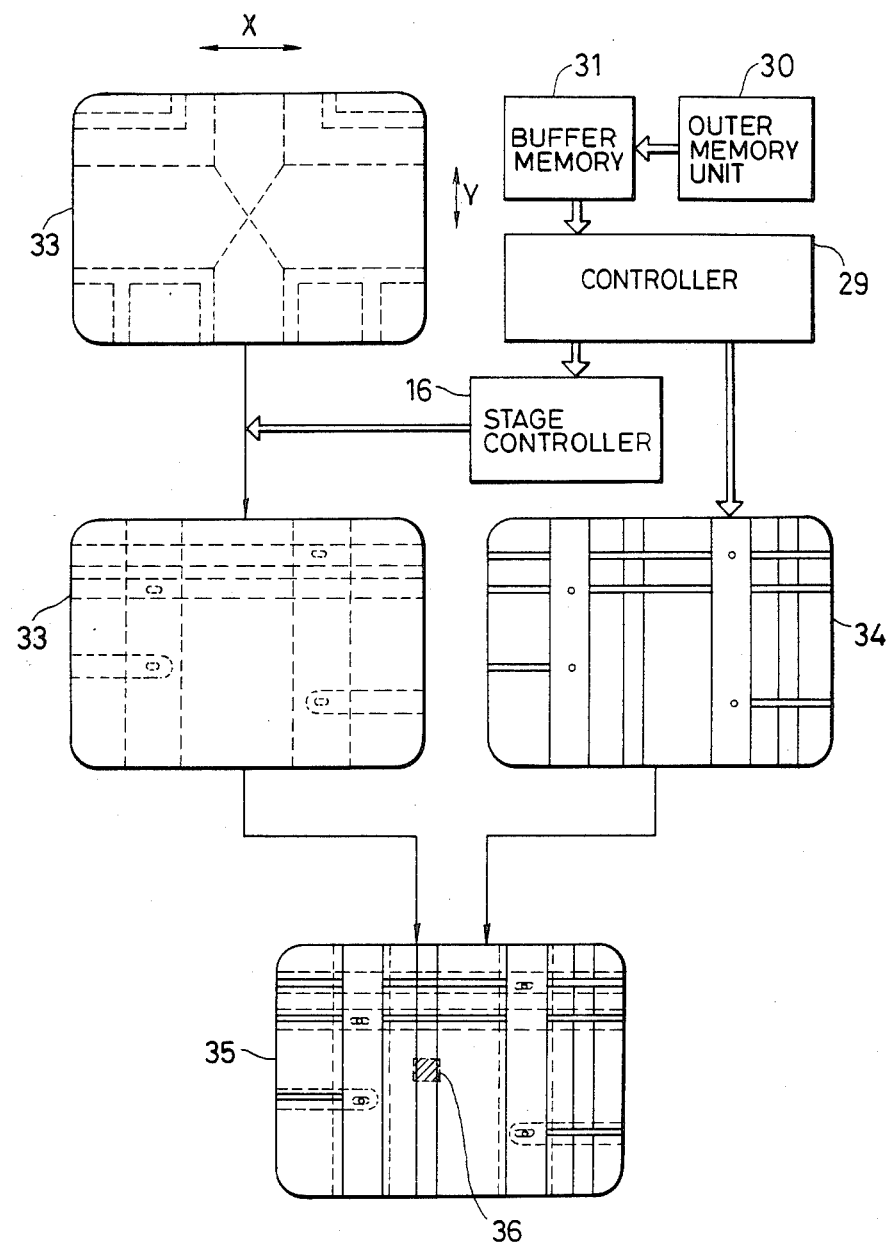
FIG. 4 is a schematic view showing the process of setting the position.
Figure 5A:
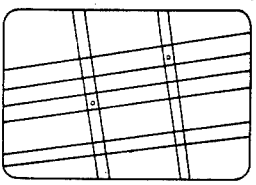
FIGS. 5(A) through 5(E) are diagrams showing the work sequence from step (1) to step (23) in the embodiment of the present invention.
Figure 5A:
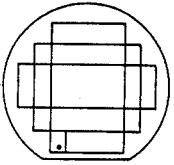
Figure 5A:
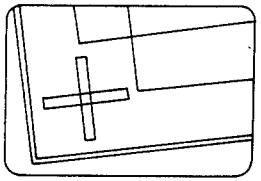
Figure 5A:
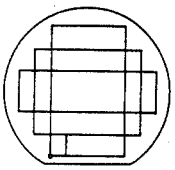
Figure 5A:
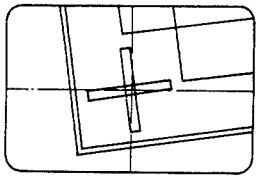
Figure 5A:
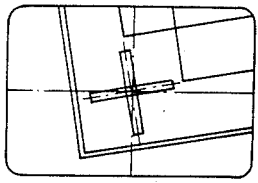
Figure 5B:
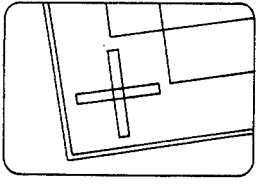
Figure 5B:
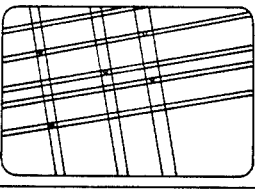
Figure 5B:
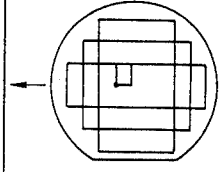
Figure 5B:
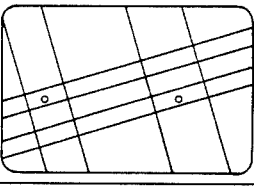
Figure 5C:
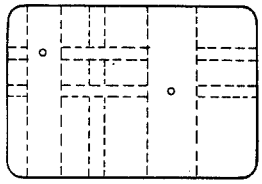
Figure 5C:
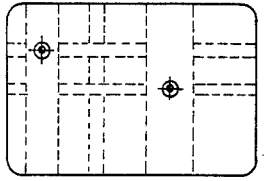
Figure 5C:
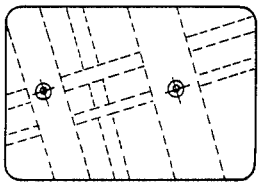
Figure 5C:
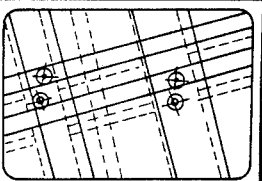
Figure 5D:
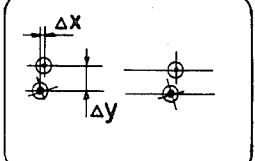
Figure 5D:
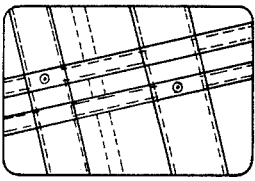
Figure 5D:
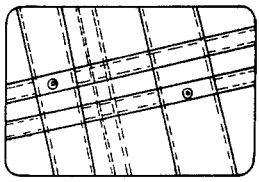
Figure 5D:
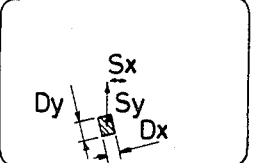
Figure 5E:
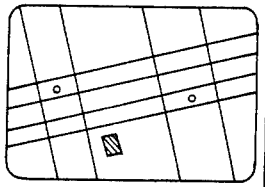

The operation of the apparatus will be described with reference to FIG. 4. First of all, the XY stage 5 is controlled by the stage controller 16 in such a fashion that corners of the chips to be worked enter the SIM image 33. If the workpiece is a wafer, for example, the laser gauge 28 sends the position information, that is, the numbers in the X and Y directions from the center, to the central processing unit 29, which then controls the stage controller 16 to move the XY stage 5. Next, the position information, that is, in what distances ($\mu$m) in both X and Y directions the work portion has moved from the chip angle, is taken into the buffer memory 31 from the outer memory unit 30 so as to control the position of the XY stage 5. In this instance, feedback is applied by the laser gauge 28 in order to obtain an accuracy of $\pm 1$ $\mu$m for the position setting of the XY stage 5.

Next, the design data of the work portion is retrieved and is displayed as a design data image 34, which is then superposed with the SIM image 33 to obtain a synthetic image 35. This synthetic image 35 also displays the position information of the Al wiring of the lowermost layer from the design data image 34. Therefore, a cursor 36 for setting the work position is moved by use of the design data image 34 to indicate the work position. The work such as cutting of the Al wiring of the lowermost layer or boring of a throughhole into the Al wiring can now be effected.

The image constituted by the design data of the device stored in the outer memory unit such as a magnetic tape is used as the different image to be superposed with the SIM image 33. Such images are disclosed, for example, in the reprint from IEEE SEVENTH INTERNATIONAL CONFERENCE ON PATTERN RECOGNITION, Proceeding July 30 - August, 1984, Montreal, Canada, CH 2046-1/84/0000/1361/01.00, C, 1984 IEEE, page 1361-1364, "An Automatic Visual Inspection System for LSI Photomasks".

This embodiment will be described in its actual practical work sequence with reference to FIG. 3 and FIGS. 5(A)-5(E). FIGS. 5(A), 5(B), 5(C), 5(D) and 5(E) show examples of the display images on CRTs 14 and 16 at the work steps.

(1) The wafer 4 is introduced into vacuum, and is set on the table 5.

(2) The chip at the left end, when the orientation flat on the orientation side of the wafer 4 is viewed as lying on the front side, is retrieved and is used as the reference chip for position detection. This chip can be easily retrieved by feeding the stage 5 in order to bring the chip below the ion optical axis.

(3) The ion beam 10 is radiated to the chip, and the secondary electrons 11 emitted from the chip are detected by the detector 6. After the signal is amplified by the head amplifier 62, the SIM image is displayed on the CRT 60 through the SIM image memory 27 and the image processor 61. At this time, a sequence of processing such as smoothing correction (noise suppresion), differential calculation (a processing which emphasizes a portion having a great change), and the like are conducted. The processing is always effected thereafter when the SIM image is to be obtained.

(4) The table 5 is moved until the right forward end of the reference chip enters the CRT 60 while observing the SIM image.

(5) The table position is adjusted so that the positioning pattern of the reference chip comes to the center, and a d.c. shift voltage is applied to the deflector 3 from the deflector controller 15 so that the positioning pattern can be positioned in the center of the CRT 60 with an accuracy of $\pm 5$ $\mu$m.

(6) The SIM image is connected to binary data by the image processor 61 for the calculation by the central processing unit 29, and the image signal is sent to the central processing unit 29.

(7) The positioning pattern is displayed on the CRT 14 connected to the central processing unit 29, and the angle variance quantity of the pattern is calculated and is then stored.

(8) The position information such as the position of the chip to be worked and the intended work position of the chip is supplied from a keyboard 63 or a floppy disk to the central processing unit 29, and the information is sent to the table controller 16 so that the position of the chip as the workpiece comes below the optical axis. The table 5 is moved while correcting the angle variance quantity. At this time, the positioning pattern of the workpiece chip is temporarily displayed on the CRT 60 to confirm that it is at the center of the CRT 60. Thereafter, the table is moved to the work position. The feed of the table is effected while detecting the position with the laser gauge 28, and the position information is always fed back to the central processing unit 29 through the laser gauge controller 32.

(9) The SIM image is displayed on the CRT 60, and the deflector voltage is adjusted to the work range set magnification (1,500 times this time). The SIM image is taken into the image processor 61, is stored and is then displayed on the CRT 60.

(10) The SIM image information is sent to the central processing unit 29 and is displayed on the CRT 14. Two points are selected as the reference points for superposing the images, and these points are applied by the keyboard 63 while watching the CRT 14.

(11) The image information inclusive of the reference points are stored in the image memory of the image processor 61.

(12) The design data of a work range is extracted from the work position of the chip and is taken into the central processing unit 29 from the outer memory unit 30 through the buffer memory 31, and is displayed on the CRT where it is magnified 1,500 times.

(13) The positions of the two reference points are input to the design data image in the same way as to the SIM image.

(14) The design data image is rotated in accordance with the angle deviation quantity of the wafer stored in the central processing unit 29, and the image information is stored in a different image memory inside the image processor 61.

(15) Inside the image processor 61, each memory calls the SIM image and the design data image, superposes them on each other, sends the resulting superposed image information to the central processing unit 29 to display the image on the CRT 14.

(16) When any variance exists in the reference points of both of the images, the deviation quantity is calculated, the design data image is called from the image processor 61 to either move or rotate the image, the image information is then sent back to the image processor 61 and both images are superposed with each other in the same way as at step 15.

(17) The keyboard 63 is operated, and two cursors are moved longitudinally and transversly in such a manner as to encompass the work range. In this case, even if the chip to be worked is a multi-layered wiring having three or more Al layers, the position of the Al wiring layer(s) that can not be observed by the SIM image can be recognized because the design data image is superposed with the SIM image, and the workpiece can be moved to that position. However, the cursors are displayed at an angle of inclination corresponding to the angle deviation quantity of the chip itself.

(18-19) The deviation quantity of the center of the range encompassed by the cursors from the center of the CRT 14, as well as the width of the cursors in both the X and Y directions are calculated. From this calculation, shift voltages in the XY directions and scanning voltages in the XY directions are calculated.

(20) The radiation conditions of the beam (such as the scanning time, the scanning speed, and the like) are determined.

(21) The deflection voltage is applied from the deflector controller 15 to the deflector 3 in accordance with the radiation condition, the shift voltage and the scanning voltage.

(22) The end of beam radiation is detected from the work time, the secondary ions, the secondary electrons or a current flowing through the substrate, and the work is stopped. The work condition is recognized (23) and another work position is effected or the wafer is taken out (24).

[Embodiment 2]

Figure 6:
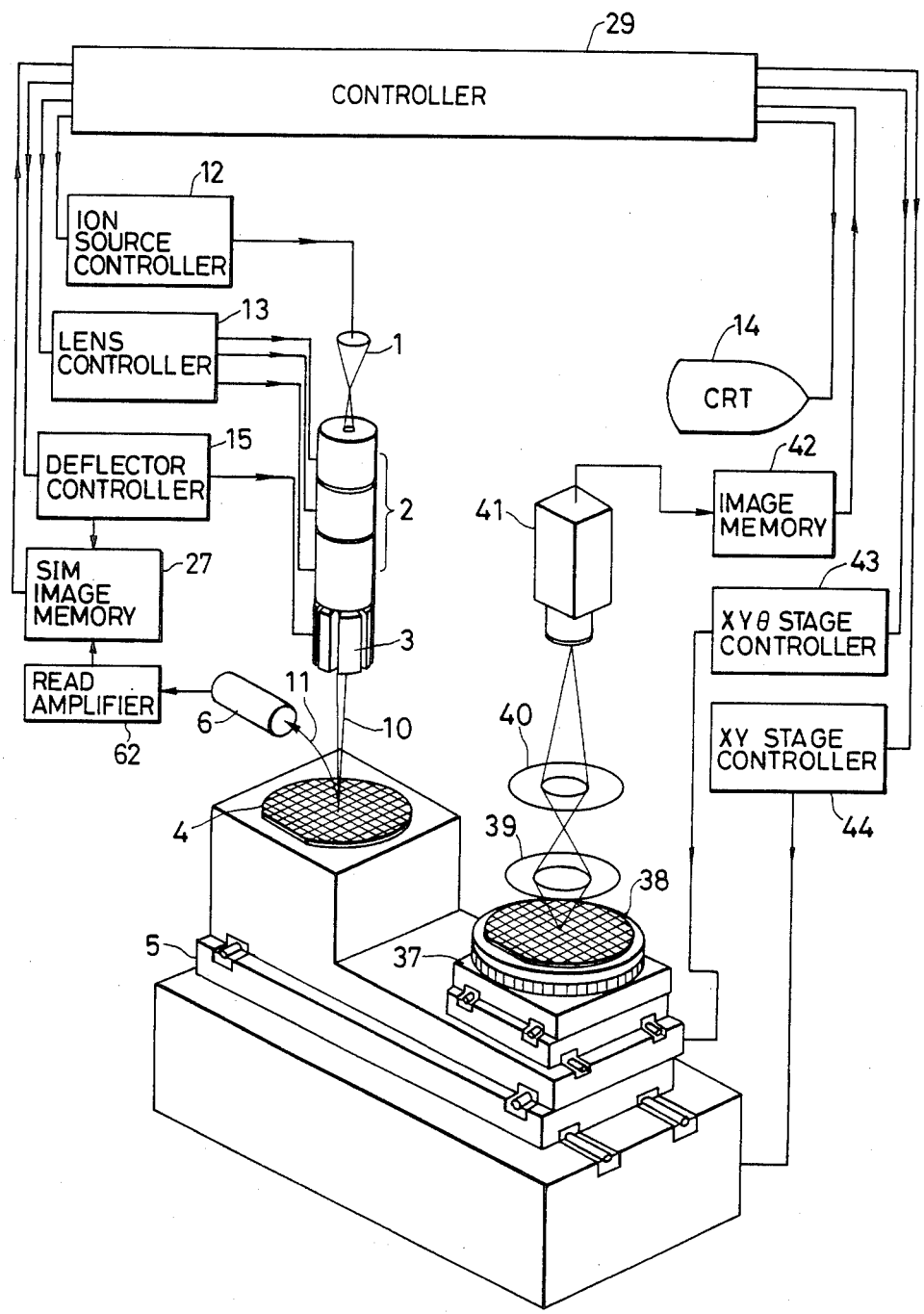
FIG. 6 is a perspective view showing the ion beam radiation apparatus in accordance with another embodiment of the invention.

FIG. 6 shows another embodiment of the present invention. In this embodiment, the SIM image and the image of an optical microscope are observed for separate chips, and these two chips are compared to set the work position. In the drawing, the ion beam optical system is the same as one shown in FIG. 3; hence, like reference numerals are used to identify like constituents.

The optical system consists of an objective lens 39, a relay lens 40 and a television camera 41, and the image information applied by the television camera 41 is temporarily stored in an image memory 42. The image of a reference chip 38 is obtained as the optical microscopic image, and the reference chip 38 is placed on the position adjusting stage 37 in order to align the position relation between the work chip 4 and the reference chip 38.

The XY θ stage 37 for position adjustment has a position setting accuracy of ±2.5 μm. Therefore, the final positioning must be effected electrically. Since the objective lens 39 is placed outside the vacuum while the reference chip 38 is placed inside the vacuum, a hermetically sealed window exists between them. Therefore, a work distance exceeding a predetermined level is necessary so that the magnification of the objective lens 39 can not be increased easily. In this embodiment, the objective lens 39 having a magnification of 40 times is employed, and the insufficiency is compensated for by electric magnification.

Figure 7:
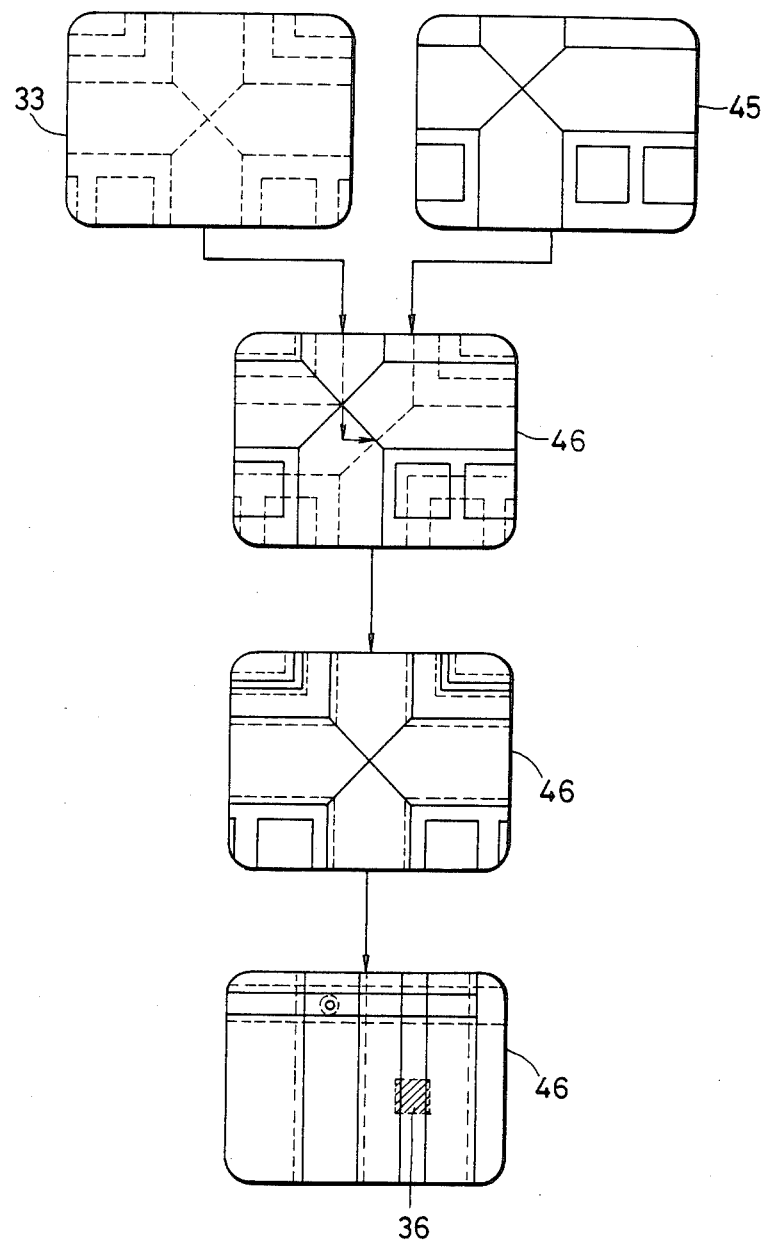
FIG. 7 is a schematic view showing the process of setting the position.

The operation of the embodiment having the construction described above will be described with reference to FIG. 7. First of all, rough position adjustment of the SIM image 33 and the optical microscopic image 45 is made mechanically by the position adjusting XYθ stage 37. After both images 33 and 45 are superposed, the optical microscopic image 45 is electrically moved so that both images 33 and 45 are in agreement with each ohter. Thus, a synthesized image 46 is formed.

Under the state described above, the synthetic image 46 is moved to the work position by moving the XY stage 5. Next, the cursors 36 are moved while observing the Al wiring pattern of the lowermost layer displayed on the synthetic image 46 to set the work position. Since this embodiment compares the two chips with each other, the work position can be set if the two chips are available. Therefore, unlike Embodiment 1, the design data for each chip need not be prepared whenever the work chip changes. Since the read-out time of the design data is not necessary, the through-put of the work is high when a large number of positions of one chip must be worked. This embodiment involves substantially the same work sequence as that shown in FIGS. 5(A) through 5(E). Moreover, software is unnecessary for reading out the design data.

However, attention must be paid to the accuracy of the stage such as clamping of the upper XYθ stage 37 so that the upper XYθ stage 37 does not move when the lower XY stage 5 is moved.

[Embodiment 3]

Figure 8:
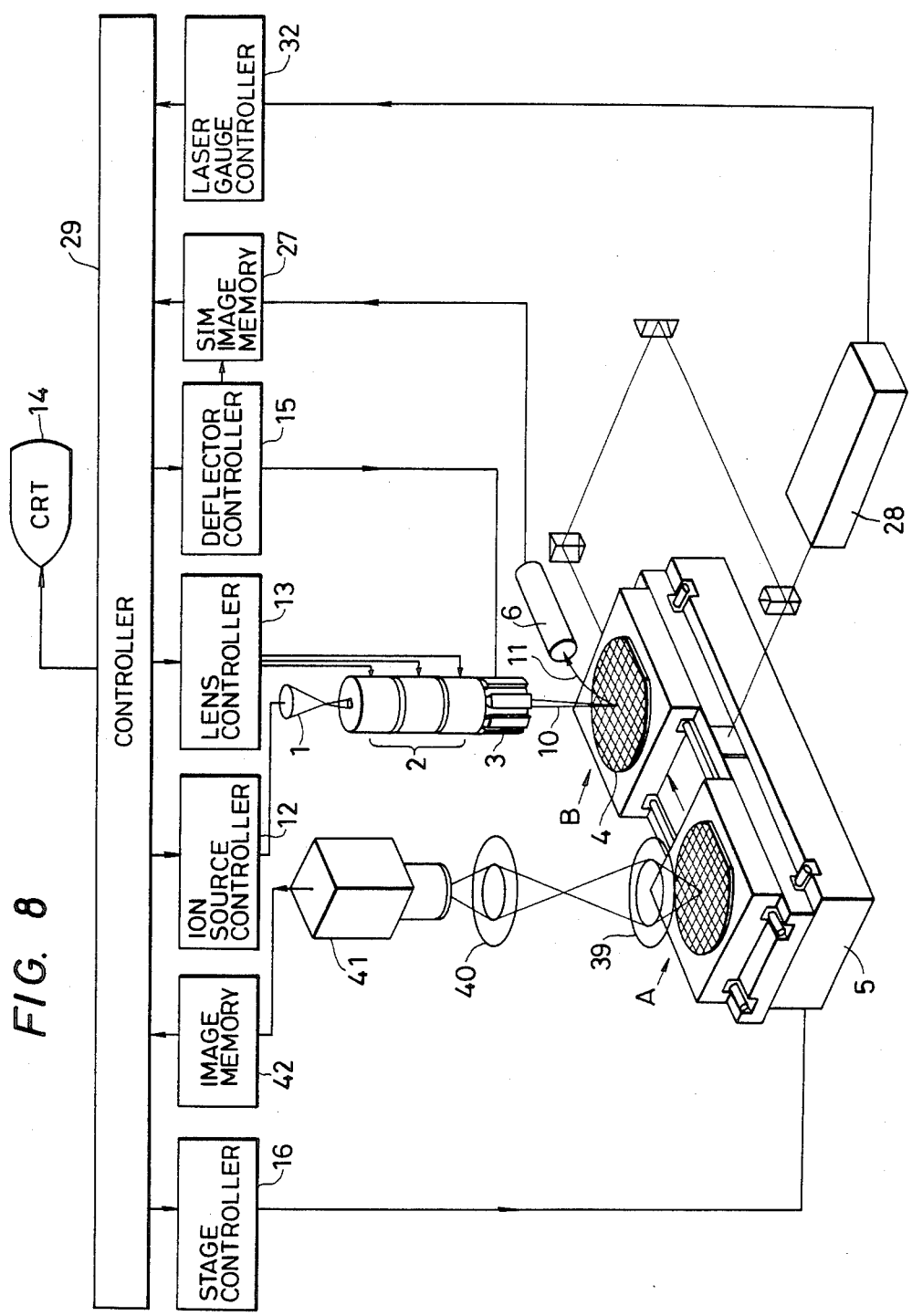
FIG. 8 is a perspective view showing the ion beam radiation apparatus in accordance with still another embodiment of the invention.
Figure 9:
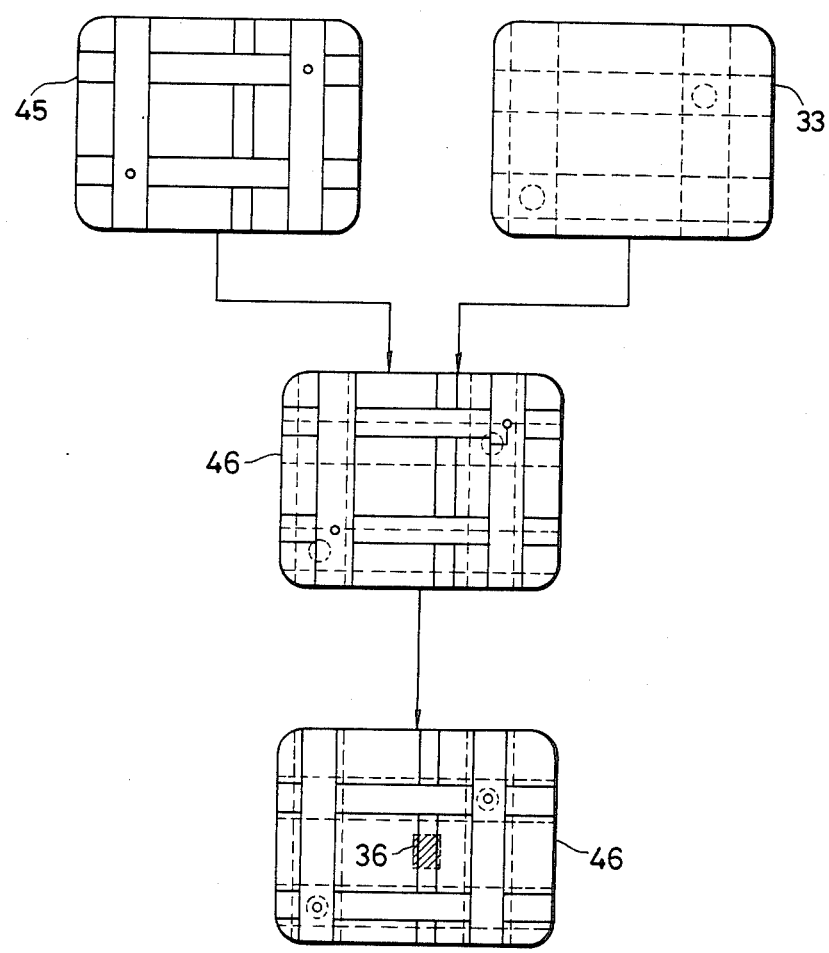
FIG. 9 is a schematic view showing the process of setting the positions.

FIG. 8 shows still another embodiment of the present invention. In this case, the table 5a supporting thereon one workpiece 4 is moved between an A position as the position of the optical axis of the optical system and a B position as the position of the optical axis of the ion beam optical system on the stage 5 by a mechanism not shown in the drawing, and these A and B positions are measured by the laser gauge 28. The position information is fed back for the purpose of positioning. When the workpiece 4 is at the A position, the optical microscopic image is taken into the workpiece 4, and when the workpiece 4 thereafter moves and reaches the B position through the table 5a, the SIM image is taken into the workpiece 4 and is superposed with the optical microscopic image. In this process, the optical microscopic image 45 and the SIM image 33 are superposed as shown in FIG. 9. When these two images 45 and 33 are superposed, a deviation of about 2 μm exists between them. Therefore, one of the images, or the optical microscopic image 45, is moved electrically in order to obtain the synthetic image 46 in which both of them are in agreement with each other.

Under this state, the synthetic image 46 is moved by the stage 5, and the cursors 36 are moved while observing the Al wiring pattern of the lowermost layer to set the work position. In this embodiment, since the stage 5 moves in a relatively long distance between the A and B positions, care must be taken to maintain position accuracy. However, the embodiment is free from the problem of position deviation due to the production error of each chip.

[Embodiment 4]

Figure 2:
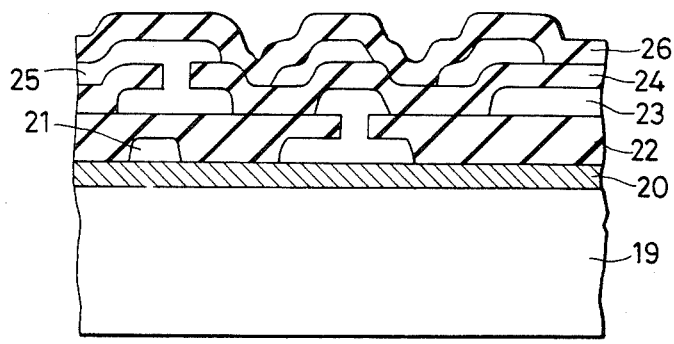
FIG. 2 is a sectional view showing an example of semiconductor devices.
Figure 3:
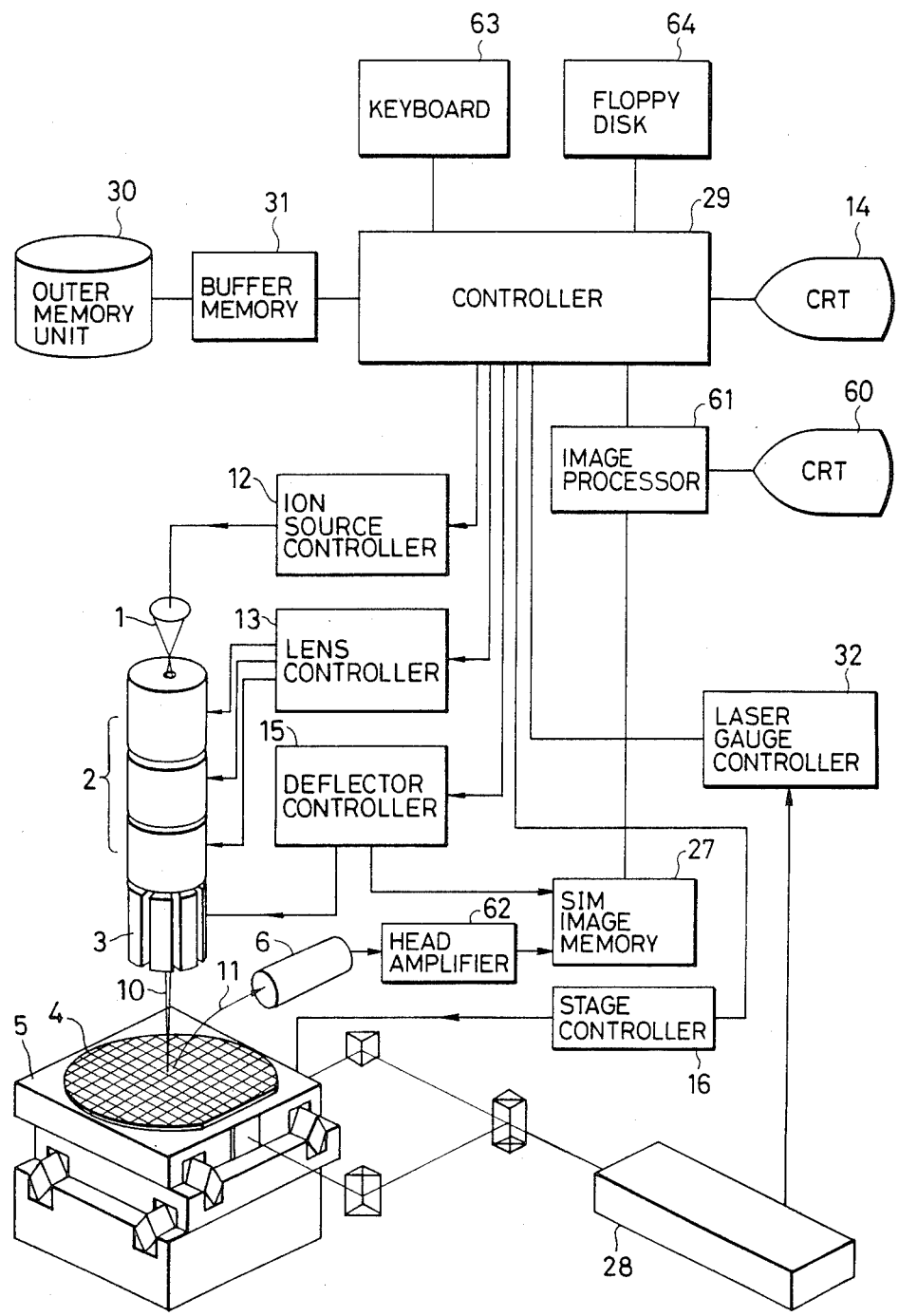
FIG. 3 is a perspective view showing an ion beam radiation apparatus in accordance with one embodiment of the present invention.
Figure 10:
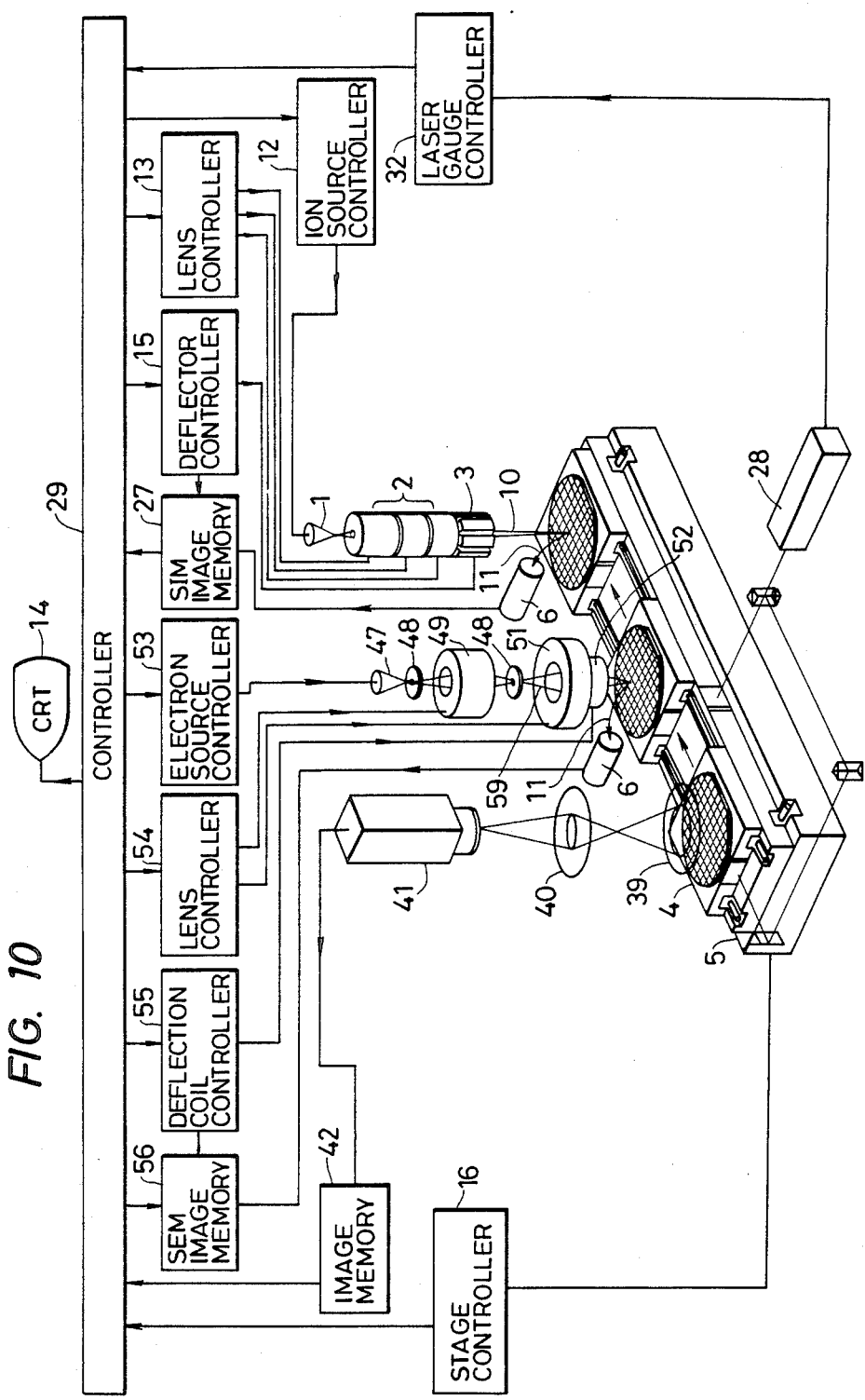
FIG. 10 is a schematic view showing still another embodiment of the invention.

The resolution of the SIM image is about 0.1 μm when a beam current is reduced. When the through-put of the work is increased by spot radiation by increasing the beam current, the resolution of the SIM image is higher than 0.5 μm, whereby accurate position setting of both images becomes difficult. To eliminate this problem, the present invention, as shown in FIG. 10 disposes a scanning electron microscope (SEM) between the optical system and the ion beam system shown in FIG. 2. The SEM consists of an electron source 47, an aperture 48, a condenser lens 49, an electron beam 50, a focusing coil 51 and a deflection coil 52.

Figure 11:
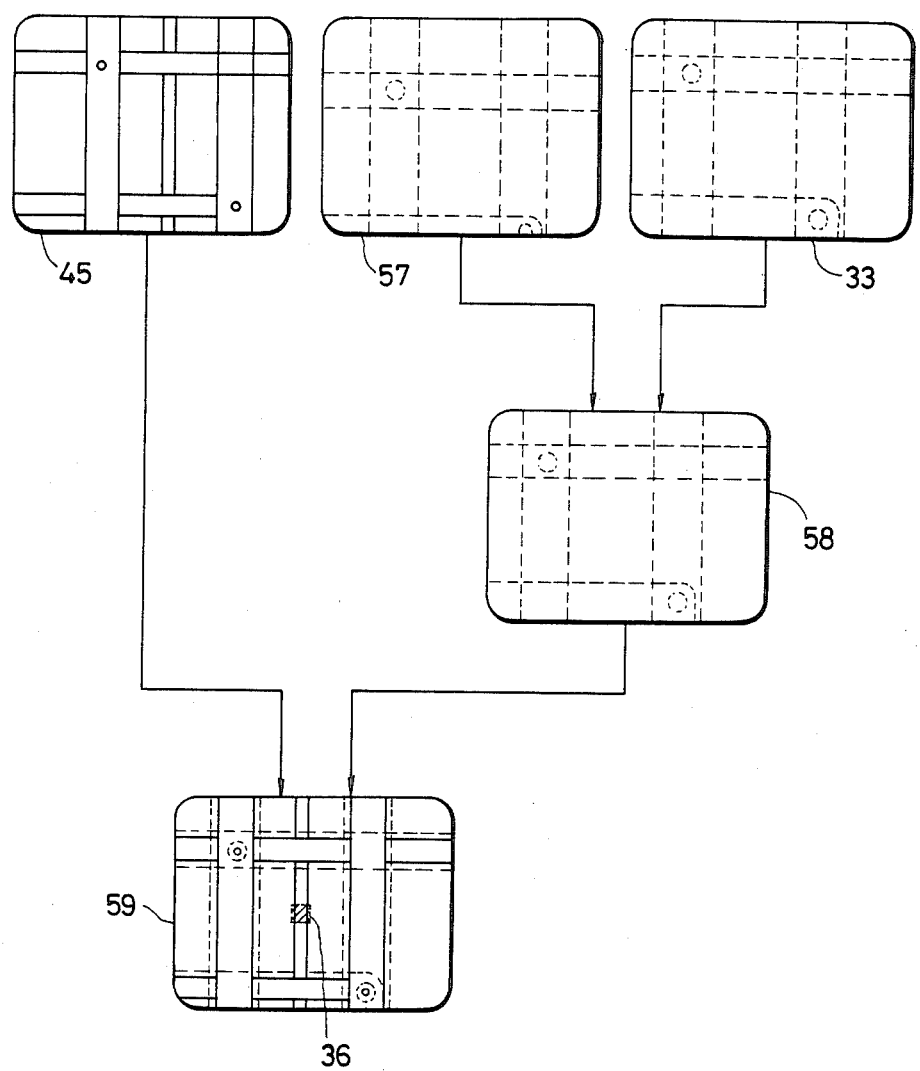
FIG. 11 is a schematic view showing the process of setting the positions.

When a semiconductor device is observed in this case as shown in FIG. 11, the surface condition of a passivation film (a protective film which limits surface instability and forms a surface having high reliability at the initial stage and which is also resistant to the change with the passage of time) is also observed. Therefore, a difference occurs in the image resolution. When the SEM image 57 and the SIM image 33 providing the equivalent images are superposed, however, the synthetic image 58 of the SEM and SIM images having an image resolution of about 0.01 μm can be obtained. Next, only the component of the SEM image 57 is extracted from this SEM-SIM synthetic image 58, and is then superposed with the optical microscopic image 45 to obtain a synthetic image 59. The work position is set while observing the positions of the lower wiring layers by this synthetic image 59.

As described above, the workpiece not containing the information on the lower wiring layers or the like in the surface structure, such as the pattern of the lowermost Al wiring layer of an LSI, does not pertain to the corrugation of the surface. Therefore, when such a workpiece is to be worked, it is sometimes necessary to work the lower wiring layers or the like whose information can not be obtained by a scanning ion microscope (SIM). However, the radiation position of the beam to the lower layer(s) can be observed by superposing the image which contains the information on the lower layers with the SIM image, so that the radiation position of the beam can be set accurately. It has been a customary practice to estimate the beam radiation position from the wiring patterns of the uppermost and second layers, so that errors have frequently occurred in setting the radiation position and the reproducibility of the beam radiation effect has been low.

In accordance with the present invention, however, the beam radiation position in relation to the lowermost wiring layer or the like can be set with an accuracy of ±0.3 μm, and hence the reproducibility of the beam radiation effect can be improved.

What is claimed is:

1. An ion beam work apparatus comprising: ion beam radiation means for focusing and radiating an ion beam extracted from an ion beam source on a target placed on a moving mechanism, and scanning two-dimensionally the ion beam radiation position;

secondary particle detection means for detecting secondary particles generated from a surface of said target by radiation of said ion beam, and forming a secondary particle image from the detection signals;

display means fopr superposing a display of said secondary particle image near a processing area formed by said secondary particles with a different image having position information not obtained from said secondary particle image and indicating a wiring layer of said target near the processing area, said different image including at least one of an optical microscope image and an image derived from an optical microscope image;

first means for detecting a relative deviation of reference points for each of said secondary particle image and said different image, and for moving at least one of said images with respect to the other of said images so that the relative deviation is minimized;

second means for setting the processing area of said target based on the position information of said different image as adjusted by said first means; and third means for processing a portion of the wiring layer of said target by radiating the ion beam from said ion beam radiation means on the processing area set by the second means;

2. The ion beam work apparatus as defined in claim 10, wherein said different image include one that is constituted from the design data of said target.

3. The ion beam work apparatus as defined in claim 1, wherein said secondary particle image is taken from said target, and said optical microscopic image is taken from a reference target which is the same kind as that of said target.

4. The ion beam work apparatus as defined in claim 3, wherein the XYθ stage for bringing the position of said reference target into agreement with the position of said target is placed on an XY stage for placing thereon both of said targets.

5. The ion beam work apparatus as defined in claim 4, wherein the relative position of both of said targets is mechanically adjusted by said XYθ stage, and then fine adjustment of said optical microscopic image is made electrically.

6. The ion beam work apparatus as defined in claim 1, wherein said is an optical microscope image obtained from said target and said target is moved to the position of the optical axis of said ion beam radiation means so as to obtain said secondary particle image from said target.

7. The ion beam work apparatus as defined in claim 6, wherein fine adjustment of the position of said optical microscopic image is effected electrically when said optical microscopic image is to be superposed after the movement of said target.

8. The ion beam work apparatus as defined in claim 1 wherein said different image comprises a combination of at least two images constituted by optical microscopic image, a scanning electron microscopic image and an image constituted by design data.

* * * * *